United States Patent [19]

Lidorenko et al.

[11] 4,234,354
[45] Nov. 18, 1980

[54] SOLAR POWER UNIT

[76] Inventors: Nikolai S. Lidorenko, 3 Mytischinskaya ulitsa, 14a, kv. 127; Tatyana A. Litsenko, ulitsa Trubnaya, 11, kv. 12; Valery N. Potapov, ulitsa Timiryazevskaya, 13, kv. 213; Stanislav V. Ryabikov, pereulok Vasnetsova, 12, kv. 64; Dmitry S. Strebkov, Kirovogradsky proezd, 3, korpus 1, kv. 17, all of Moscow, U.S.S.R.

[21] Appl. No.: 31,983

[22] Filed: Apr. 20, 1979

[51] Int. Cl.³ .......................... H01L 31/04; F24J 3/02
[52] U.S. Cl. .................................... 136/246; 136/206; 136/259; 126/418; 126/438; 126/439; 350/292; 350/299
[58] Field of Search ........ 136/89 CA, 89 PC, 89 HY, 136/206; 126/417, 418, 438, 439; 350/288, 292, 299

[56] References Cited

U.S. PATENT DOCUMENTS

| | | | |
|---|---|---|---|
| 3,713,727 | 1/1973 | Markosian et al. | 350/292 |
| 3,923,381 | 12/1975 | Winston | 350/293 |
| 4,023,555 | 5/1977 | Bailey | 126/424 |
| 4,137,897 | 2/1979 | Moore | 126/270 |
| 4,144,095 | 3/1979 | Mlavsky | 136/89 |
| 4,153,476 | 5/1979 | Shelpuk | 136/89 PC |

FOREIGN PATENT DOCUMENTS 330312 10/1972 U.S.S.R. .
362977 11/1973 U.S.S.R. .

*Primary Examiner*—Aaron Weisstuch
*Attorney, Agent, or Firm*—Steinberg & Blake

[57] ABSTRACT

The hereinproposed solar power unit comprises a solar energy collector made up of mirror facets and a solar energy receiver. A sun-light-sensitive surface of the receiver is exposed to a radiation flux reflected by the collector. Each facet of the collector is hermetically enclosed in a radiation-transparent convex shell filled with a reducing agent. The shells have a radius of curvature of 20 to 200 mm.

4 Claims, 6 Drawing Figures

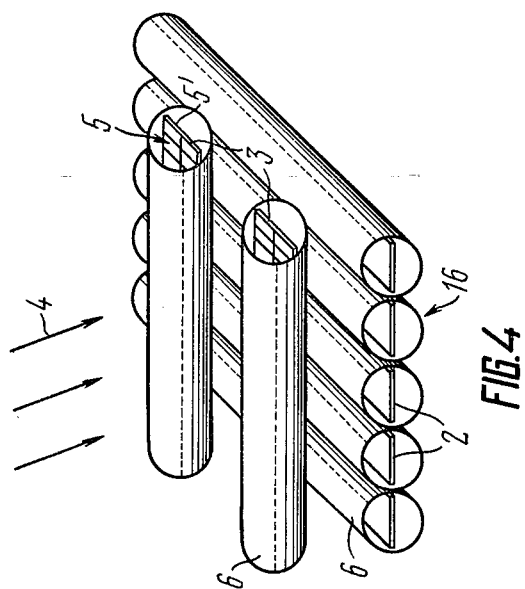
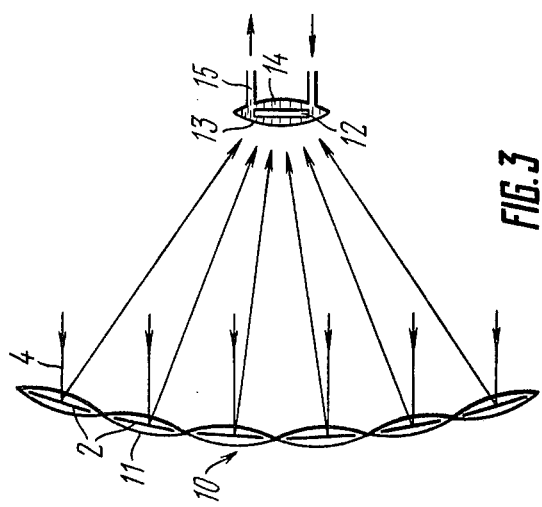

1

SOLAR POWER UNIT

FIELD OF THE INVENTION

The present invention relates to devices for converting solar energy into other forms of energy and in particular to solar power units supplying, for example, electric energy to ground installations located primarily in remote regions.

PRIOR ART

Known in the art is a solar power unit comprising a solar energy collector in the form of a mirror reflector made up of facets and a solar energy receiver employing a heat-receiving surface located in the focus of the collector and exposed to a radiation flux reflected by the collector (cf. USSR Inventor's Certificate No. 330,312, Cl. F24j 3/02). The aforesaid solar power unit has been generally unsatisfactory due to low reliability and a comparatively short service life, these limitations being associated with the fact that its structural components are exposed to adverse environmental effects.

Another known solar power unit comprises a parabola-cylindrical solar energy mirror collector made up of facets and a solar-to-electric energy converter whose solar cells are arranged in a focal plane of the collector. The solar cells are cemented to heat sinks and protected with a glass coating fixed to the working surface thereof with optical adhesive (cf. USSR Inventor's Certificate No. 362,977, Cl. F24j 3/02).

Despite the fact that the solar cells of the aforementioned power unit are provided with a protective coating, its maintenance involves such labour-consuming operations as periodic removal of dust and dirt from the photocollector mirrors and solar cells.

BRIEF DESCRIPTION OF THE INVENTION

It is an object of the present invention to extend the service life of a solar power unit.

Another object of the invention is to decrease labour consumption in utilizing a solar power unit.

The foregoing objects are attained by a solar power unit comprising a solar energy collector in the form of a mirror reflector made up of facets and a solar energy receiver whose sun-light-sensitive surface is exposed to a radiation flux reflected by the collector, and according to the invention, each facet of the collector is hermetically enclosed in a radiation-transparent convex shell filled with a reducing agent.

The shells are preferably made in the form of cylinders curved to a radius of 20 to 200 mm.

Each shell may also be composed of two identical spherical segments.

The solar power unit forming the subject of the present invention features a longer service life due to the fact that its basic components are adequately protected from adverse environmental effects. It is also reliable in operation and consumes less labour.

The invention will be described further with reference to specific embodiments thereof, taken in conjunction with the accompanying drawings.

BRIEF DESCRIPTION OF DRAWINGS

The invention will be described further with reference to specific embodiments thereof, taken in conjunction with the accompanying drawings wherein:

FIG. 3 shows a solar power unit with shells composed of spherical segments;

FIG. 4 shows a solar power unit with a collector in the form of a flat reflector;

DETAILED DESCRIPTION OF THE INVENTION

Figure 1:
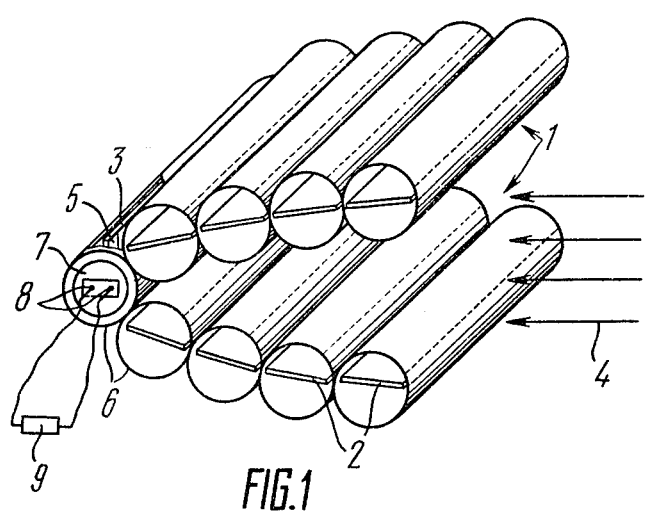
FIG. 1 shows a solar power unit with a collector in the form of a wedge.

The solar power unit of FIG. 1 comprises a solar energy collector 1 in the form of a mirror reflector made up of facets 2 and shaped as a wedge. Arranged in the focus of the collector 1 is a solar energy receiver incorporating a photoelectric converter 3 whose surface 5 sensitive to sunlight 4 is exposed to a radiation flux reflected by the collector 1. Each facet of the collector 1 and the photoelectric converter 3 are hermetically enclosed in a transparent glass shell 6 of cylindrical shape. Installed on the end face of the shell 6 of the photoelectric converter 3 is a metal cap 7 through which conductors 8 are brought out of the shell 6 wihtout impairing its tightness. The conductors 8 are connected to the leads of a load 9. The shells 6 are curved to a radius of curvature of from about 20 to 200 mm and filled with a reducing agent (hydrogen).

Figure 2:
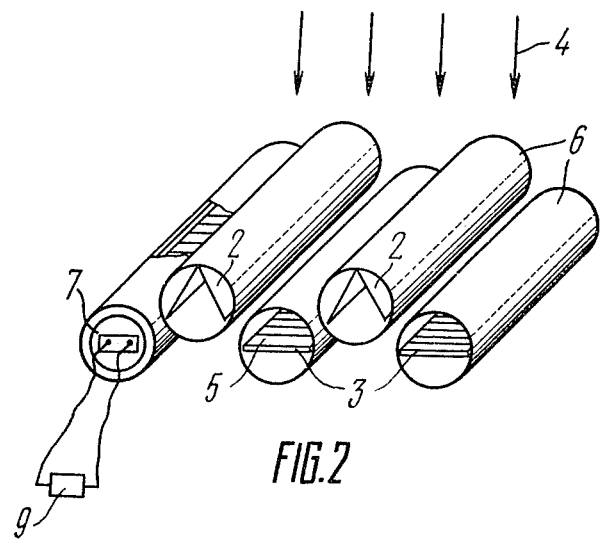
FIG. 2 shows a solar power unit with a collector composed of two flat facets.

One embodiment of the invention shown in FIG. 2 comprises several photoelectric converters 3, each of which is interposed between the two flat mirror facets 2 inclined at a certain angle to the surface 5 of the photoconverter and forming a facet collector. With this arrangement, each of the pair of facets 2 is inclined towards one another and belonging to the adjacent photoelectric converters 3 are hermetically enclosed in one shell 6. Also, each photoelectric converter 3 is hermetically enclosed in the cylindrical shell 6.

Another embodiment of the invention shown in FIG. 3 comprises a collector 10 in the form of a paraboloidal mirror reflector composed of the flat facets 2. Each facet 2 is hermetically enclosed in a transparent shell 11 made up of two identical spherical segments and filled with a hydrogen-and-argon mixture. Preferably each spherical segment has a diameter of 0.2 to 0.4 m. Arranged in the focus of the collector 10 is a solar energy receiver incorporating a heat-receiving surface 12 hermetically enclosed in a transparent vessel 13 filled with a heat-transfer agent 14 and provided with channels 15 permitting circulation of the heat-transfer agent 14 through a consuming line (not shown in the drawing).

Figure 5:
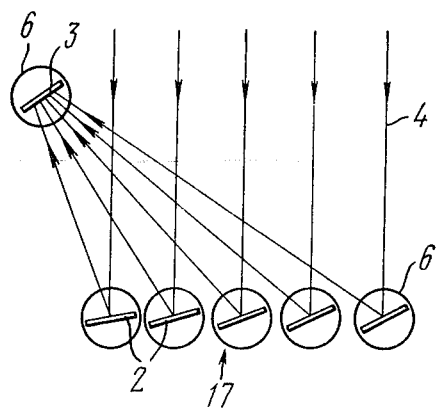
FIG. 5 shows a solar power unit with a collector in the form of Fresnel mirrors.

Still another embodiment of the invention shown in FIG. 4 comprises a collector 16 in the form of a flat mirror reflector made up of flat facets 2, each of which is hermetically enclosed in a shell 6. Also, the photoelectric converters 3 are hermetically enclosed in the cylindrical shells 6, each converter having two sunlight-sensitive surfaces 5 and 5'. The photoelectric converters 3 are arranged over the surface of the collector 16 with respect to the direction of the sunlight 4 and normal to the facets 2, the converters being separated by a distance approximately equalling the diameter of the shell 6 so that the sunlight 4 may impinge the mirror surfaces of the facets 2.

a further embodiment of the invention shown in FIG. 5 comprises a collector 17 in the form of Fresnel mirrors made up of individual flat facets 2. Each facet 2 and the photoelectric converter 3 receiving radiation reflected by the collector 17 are hermetically enclosed in the transparent shells 6. The photoelectric converter 3 is located in the focus of the collector 17.

Figure 6:
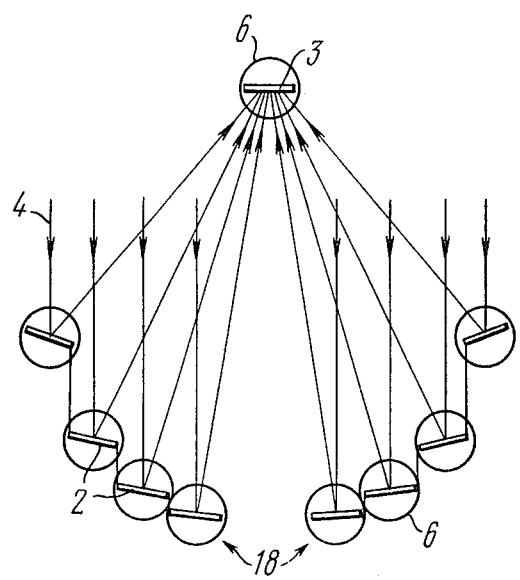
FIG. 6 shows a solar power unit with a collector in the form of Fresnel mirrors having zero coma.

A still further embodiment of the invention shown diagramatically in FIG. 6 comprises a collector 18 in the form of Fresnel mirrors having zero coma and made up of the flat facets 2. Each facet 2 and the photoelectric converter 3 located in the focus of the collector 18 are hermetically enclosed in a corresponding transparent shell 6.

The hereinproposed solar power unit operates in the following manner.

The sunlight 4 (FIGS. 1 and 2) reflected from the mirror facets 2 impinges the surface 5 of the photoelectic converter 3. The solar energy received by the surface 5 is converted into electric current which is then applied to the load 9 through the conductors 8.

It should be noted that the solar unit of FIG. 2 provides for higher radiation flux density on the sensitive surface 5 due to reflection from the surface of the flat facets 2 and reflection from the surface of the cylindrical glass shells 6.

In operation of the embodiment shown in FIG. 3, the sunlight 4 is reflected from the mirror facets 2 and collected on the heat-receiving surface 12, thereby heating the latter. The heated surface 12 transfers the received heat to the heat-transfer agent 14 which conveys the heat to the consumer.

In operation of the embodiment shown in FIG. 4, the sunlight 4 impinges the surface 5 of the photoelectric converter 3 exposed thereto. Having passed through gaps between the photoelectric converters 3, the sunlight 4 reflected by the mirror facets 2 also impinges the surfaces 5' of the photoelectric converters 3 facing the collector 16. The solar energy received by the surfaces 5 and 5' of the photoelectric converters 3 is converted into electric current and applied to the load (not shown in FIG. 4).

The embodiments of the invention shown in FIGS. 5 and 6 operate in much the same manner as the solar power unit shown in FIG. 1.

It should be noted, however, that the solar power units of FIGS. 5 and 6 provide for more uniform illumination of the sensitive surface 5 of the photoelectric converter 3, the advantage being more pronounced in the case of the solar power unit illustrated in FIG. 6.

The cylindrical and spherical surfaces of the glass shells 6 and 11 having a small radius of curvature ranging from 20 to 200 mm, facilitate removal of dust and dirt therefrom and provide for stable electric characteristics of the solar power unit in operation. This obviates the need for maintenance, an advantage substantially reducing operational cost and being vital in the power supply of individual consumers in remote localities.

What is claimed is:

1. A solar power unit comprising: a solar energy collector in the form of a mirror reflector assembly, said mirror reflector assembly including a plurality of flat mirror facets, each of said mirror facets being enclosed within a respective one of a plurality of hermetically sealed convexly shaped shells formed of a material which is transparent to radiation, and wherein each of said shells is filled with a reducing agent in intimate contact with said mirror facet enclosed therewithin; and a solar energy receiver; said receiver adapted to be exposed to a radiation flux reflected by said collector.

2. A solar power unit as claimed in claim 1, further comprising several of said solar energy receivers, said receivers and said shells being arranged in an alternating manner, two of said facets being enclosed in each of said shells and inclined towards one another at an acute angle so as to direct sunlight to the adjacent receivers.

3. A solar power unit as claimed in claim 1 wherein said solar energy receiver comprises a photoelectric converter including a surface which is sensitive to sunlight.

4. A solar power unit as claimed in claim 1 wherein said energy receiver comprises means for heating a circulating heat-transfer agent.

* * * * *